(12) United States Patent
Abella et al.

(10) Patent No.: US 10,020,037 B2
(45) Date of Patent: Jul. 10, 2018

(54) CAPACITY REGISTER FILE

(75) Inventors: Jaume Abella, Barcelona (ES); Javier Carretero Casado, Barcelona (ES); Pedro Chaparro Monferrer, Barcelona (ES); Xavier Vera, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 11/953,444

(22) Filed: Dec. 10, 2007

(65) Prior Publication Data

US 2009/0150649 A1  Jun. 11, 2009

(51) Int. Cl.
*G06F 11/00* (2006.01)
*G11C 8/04* (2006.01)

(52) U.S. Cl.
CPC ....................... *G11C 8/04* (2013.01)

(58) Field of Classification Search
USPC ............ 365/200; 712/4; 714/6, 7, 8, 10, 710
See application file for complete search history.

(56) References Cited

U.S. PATENT DOCUMENTS

| | | | |
|---|---|---|---|
| 4,630,241 A * | 12/1986 | Kobayashi et al. | 365/200 |
| 5,602,786 A * | 2/1997 | Pascucci et al. | 365/200 |
| 5,644,699 A * | 7/1997 | Yoshida | 714/7 |
| 5,825,682 A * | 10/1998 | Fukui | 365/49.17 |
| 6,374,347 B1 * | 4/2002 | Johnson | 712/228 |
| 6,625,746 B1 * | 9/2003 | Moore | 714/6 |
| 6,665,790 B1 * | 12/2003 | Glossner et al. | 712/4 |
| 6,748,519 B1 * | 6/2004 | Moore | 712/217 |
| 6,941,489 B2 * | 9/2005 | DeLano | 714/10 |
| 7,512,772 B2 * | 3/2009 | Gschwind et al. | 712/227 |
| 7,587,582 B1 * | 9/2009 | Sudharsanan et al. | 712/221 |
| 7,684,265 B2 * | 3/2010 | Bankman et al. | 365/200 |
| 2004/0103262 A1 * | 5/2004 | Glossner et al. | 712/4 |
| 2005/0071723 A1 * | 3/2005 | Luick | 714/747 |
| 2005/0108503 A1 * | 5/2005 | Sandon et al. | 712/4 |
| 2006/0077733 A1 * | 4/2006 | Cheng et al. | 365/200 |
| 2006/0077734 A1 * | 4/2006 | Fong | 365/200 |
| 2007/0016758 A1 * | 1/2007 | Tremblay et al. | 712/220 |
| 2007/0291563 A1 * | 12/2007 | Ilkbahar et al. | 365/201 |
| 2008/0046681 A1 * | 2/2008 | Sandon et al. | 712/4 |

OTHER PUBLICATIONS

Canal, Ramon, et al. "Very Low Power Pipelines using Significance Compression", Copyright 2000, IEEE. pp. 181-190.
Kondo, Masaaki, et al. "A Small, Fast and Low-Power Register File by Bit-Partitioning", Proceedings of the 11th International Symposium on High-Performance Computer Architecture (HPCA-11 2005). Copyright 2005, 10 pages.

* cited by examiner

*Primary Examiner* — Robert Beausoliel
*Assistant Examiner* — Joshua P Lottich
(74) *Attorney, Agent, or Firm* — Erik M. Metzger

(57) ABSTRACT

An apparatus for storing X-bit digitized data, the register file comprising: a plurality of registers each register configured for storing X bits, wherein each register is partitioned into Y sub-registers such that each sub-register stores at least X/Y bits, and wherein at least one extra X/Y-bit sub-register is incorporated in each register to provide redundancy in the number of sub-registers for a total of at least Y+1 sub-registers per register, so that if a first sub-register in a first register includes faulty bits, data destined for storage in the first sub-register is stored in a second sub-register, in the first register, that does not include faulty bits.

15 Claims, 7 Drawing Sheets

CAPACITY REGISTER FILE

COPYRIGHT & TRADEMARK NOTICES

A portion of the disclosure of this patent document contains material, which is subject to copyright protection. The owner has no objection to the facsimile reproduction by anyone of the patent document or the patent disclosure, as it appears in the Patent and Trademark Office patent file or records, but otherwise reserves all copyrights whatsoever.

Certain marks referenced herein may be common law or registered trademarks of third parties affiliated or unaffiliated with the applicant or the assignee. Use of these marks is for providing an enabling disclosure by way of example and shall not be construed to limit the scope of this invention to material associated with such marks.

TECHNICAL FIELD

The present invention relates generally to register files and, more particularly, to partitioning of register files to improve storage.

BACKGROUND

A register file is an array of processor registers in a central processing unit (CPU), or processor. Modern integrated circuit-based register files are usually implemented by way of fast static random access memories (SRAMs) with multiple ports. Such SRAMs are distinguished by having dedicated read and write ports. The instruction set architecture of a conventional CPU may typically define a set of registers which are used to stage data between memory and the functional units on an Integrated circuit (IC), also referred to as a chip.

ICs have consistently migrated to smaller feature sizes over the years, allowing more circuitry to be packed on each chip. This increased capacity per unit area can be used to decrease cost or increase functionality per unit area. In general, as the feature size shrinks, many characteristics improve. For example, the cost per unit and the switching power consumption go down, and the speed goes up.

Since these speed and power consumption gains are apparent to the end user, there is strong motivation to use finer geometries to shrink the dimensions of device elements and line features in electronic circuits. In order to increase device density on a wafer comprising a number of circuit chips, the supply voltage (VDD) needs to be scaled appropriately to power devices, primarily because scaling critical dimensions of a device requires scaling the driving voltage to provide the same electric field density that governs current density, field effects and amplification, etc.

Unfortunately, process variations may not similarly scale in a cooperative manner, leading to larger relative variability in device performance. In addition, lower voltage margins, due to the smaller absolute voltage range, may raise the faulty bit rate severely as feature size declines toward 22 nm and downward. Processors implemented with ever decreasing line width dimensions may lead to higher faulty bit rates in structures with large number of ports, such as register files. Thus, solutions for maintaining satisfactory register file yield must be provided to enable timely implementation.

BRIEF DESCRIPTION OF THE DRAWINGS

Embodiments of the present invention are understood by referring to the figures in the attached drawings, as provided below.

Features, elements, and aspects of the invention that are referenced by the same numerals in different figures represent the same, equivalent, or similar features, elements, or aspects, in accordance with one or more embodiments.

DETAILED DESCRIPTION OF EXEMPLARY EMBODIMENTS

Figure 1:
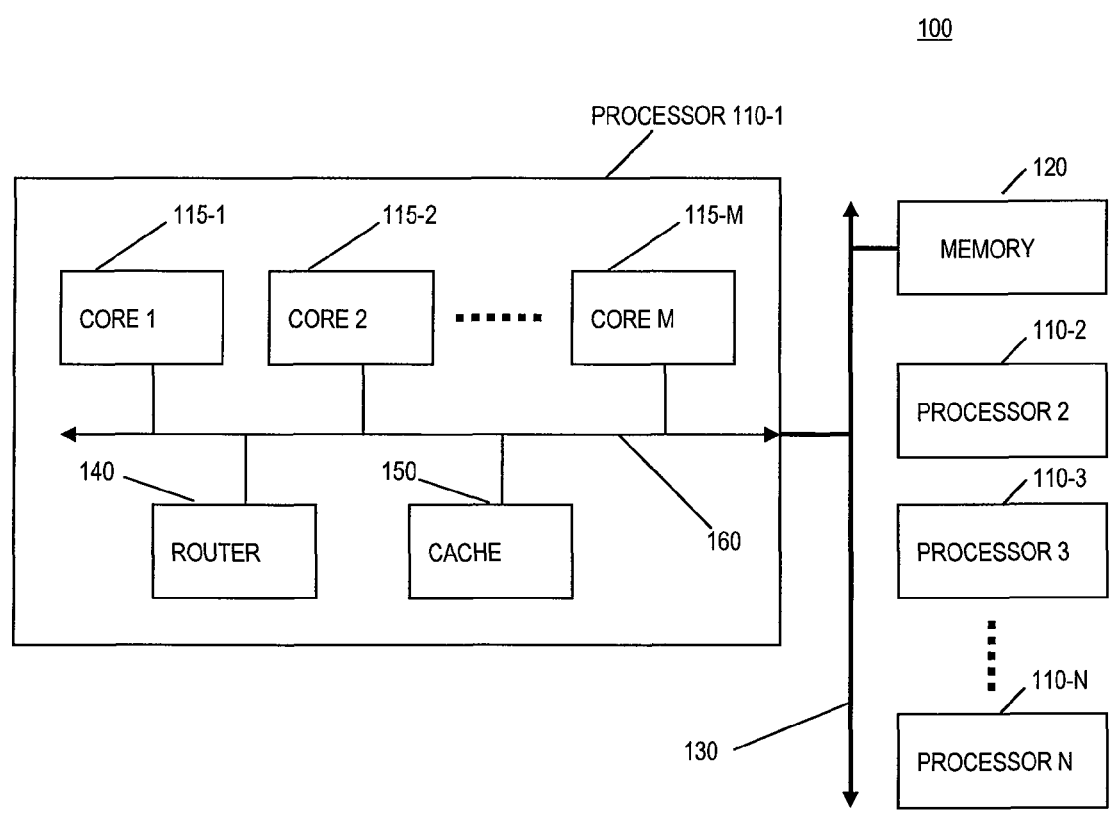
FIG. 1 illustrates an operative computing environment according to one embodiment.

Methods and systems are proposed to increase the yield of a register file having faulty bits.

For purposes of summarizing, certain aspects, advantages, and novel features of the invention have been described herein. It is to be understood that not all such advantages may be achieved in accordance with any one particular embodiment of the invention. Thus, the invention may be embodied or carried out in a manner that achieves or optimizes one advantage or group of advantages without achieving all advantages as may be taught or suggested herein.

A redundant register file for storing X-bit digitized data, in accordance with one embodiment, comprises a plurality of registers each register configured for storing X bits. Each register is partitioned into Y sub-registers such that each sub-register stores X/Y bits. At least one extra sub-register of at least X/Y bits is incorporated in each register to provide redundancy in the number of sub-registers for a total of at least Y+1 sub-registers per register, so that if a first sub-register in a first register includes faulty bits, data destined for storage in the first sub-register is stored in a second sub-register of the first register that does not include faulty bits.

A first data structure stores values associated with each sub-register in a register, wherein a first value indicates that the sub-register includes faulty bits and a second value indicates that the sub-register does not include faulty bits. A second data structure stores a reference to each register based on values in the first data structure to indicate whether a register is available to support a data operation.

A split register file, in accordance with another embodiment, is provided. The split register file comprises a plurality of registers each register configured for storing X bits, wherein each register is partitioned into Y sub-registers such that each sub-register stores at least X/Y bits, and wherein if a first selected sub-register in a first register having faulty bits is unavailable for supporting a data operation, data destined for storage in the first sub-register is stored in a second selected sub-register in a second register that does not include faulty bits.

The split register file may comprise N registers, each partitioned into Y sub-registers, such that each partition includes sub-registers $R_1$ through $R_N$, respectively in one of said N registers, such that if a first selected sub-register in a first partition is unavailable for supporting a data operation due to faulty bits, data destined for storage in the first selected sub-register is stored in a second selected sub-register in the first partition that does not have faulty bits.

In certain embodiments, a first data structure stores values associated with each sub-register in a register, wherein a first value indicates that the sub-register includes faulty bits and a second value indicates that the sub-register does not include faulty bits. A second data structure stores a reference to each register based on values in the first data structure to indicate whether a register is available to support a data operation.

In accordance with another embodiment, a system comprising one or more logic units is provided. The one or more logic units are configured to perform the functions and operations associated with the above-disclosed methods. In accordance with yet another embodiment, a computer program product comprising a computer useable medium having a computer readable program is provided. The computer readable program when executed on a computer causes the computer to perform the functions and operations associated with the above-disclosed methods.

One or more of the above-disclosed embodiments, in addition to certain alternatives, are provided in further detail below with reference to the attached figures. The invention is not, however, limited to any particular embodiment enclosed.

FIG. 1 shows an operative computing environment 100, which may include one or more processors 110-1 to 110-N, and a memory 120 capable of communicating with each other over a communication bus 130. Each of the processors 110-1 to 110-N may vary in detailed structure, but in an exemplary configuration, a processor 110-1 may include one or more cores 115-1 to 115-M, a router 140, and a cache 150, all of which are in communication over an internal processor bus 160, wherein the internal processor bus 160 is further capable of communication with the other components of the operative computing environment 100, which may include other processors, memory, connections to other networks, etc.

A router 140 extracts the destination of a packet it receives, selects the best path to that destination, and forwards data packets to the next device along this path. Cache 150 is a temporary storage area where frequently accessed data can be stored for rapid access. Once the data is stored in cache 150, future use can be made by accessing the cached copy rather than re-fetching or re-computing the original data, so that the average access time is shorter. Cache 150, therefore, helps expedite data access that the processor 110-1 would otherwise need to fetch from main memory 120, for example. Processors 110 may have one or more caches 150. Multiple caches in a processor may be organized into levels, e.g. level 1 (L1), level 2 (L2), etc. and the hierarchy may be based on size.

Figure 2:
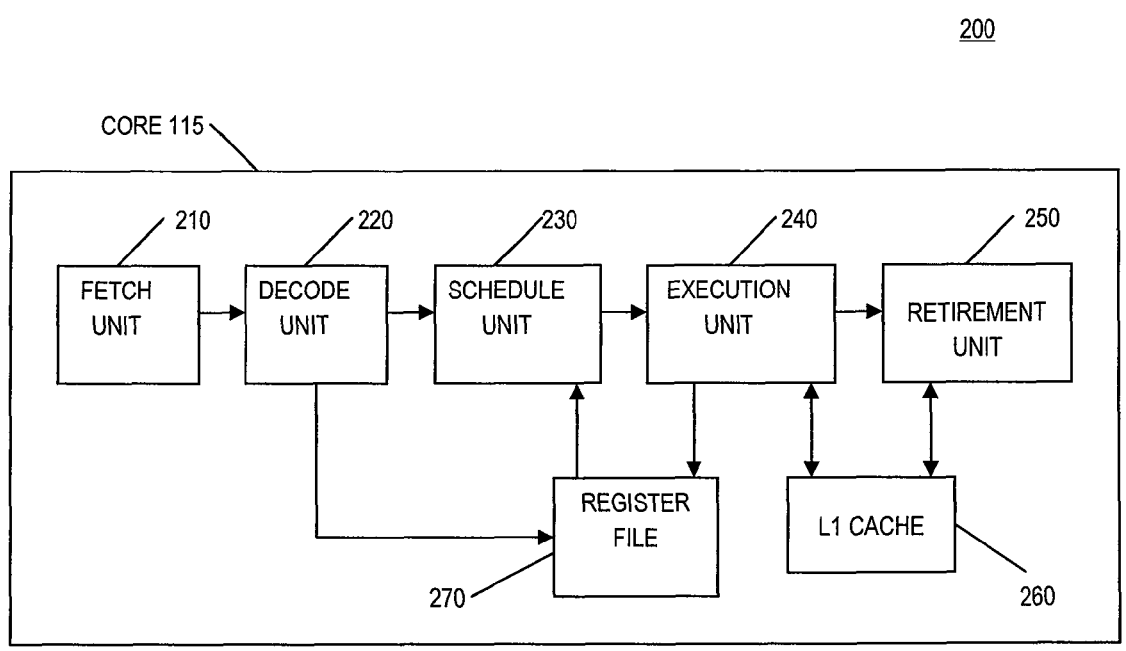
FIG. 2 illustrates a core processor architecture according to one embodiment.

A processor may contain one or more cores 115. FIG. 2 illustrates an exemplary architecture 200 for a core 115, according to one embodiment. Core 115 may include a fetch unit 210, a decode unit 220, a schedule unit 230, an execution unit 240, a retirement unit 250, a level 1 (L1) cache 260, and a register file 270. Referring to FIGS. 1 and 2, fetch unit 210 fetches the instruction from a memory 120 (or equivalent) via internal processor bus 160, communication bus 130, or both, for decoding in decoder unit 220. Fetch unit 210 causes the fetched instruction to be placed in a special register (not shown) to be operated on by execution unit 240.

Instruction decoder (i.e., decode unit 220) decodes an instruction into signals (i.e., microcode) used by the execution unit 240 for performing an operation according to the instruction being executed. Each instruction may have one or more input operands and one or more output operands. When an instruction is scheduled for execution by schedule unit 230, register file 270 is accessed with identifiers of its input operands (i.e., tags, which may provide the location of the register holding the operand). Data retrieved from register file 270 is operated on in execution unit 240 as provided by the instruction, and the one or more output operands are stored back to the register file 270 in the entry location indicated by the instruction (i.e., destination tag). Core 115 may be in communication with other cores, higher level cache, and other processors via a communications bus architecture, for example.

Figure 3:
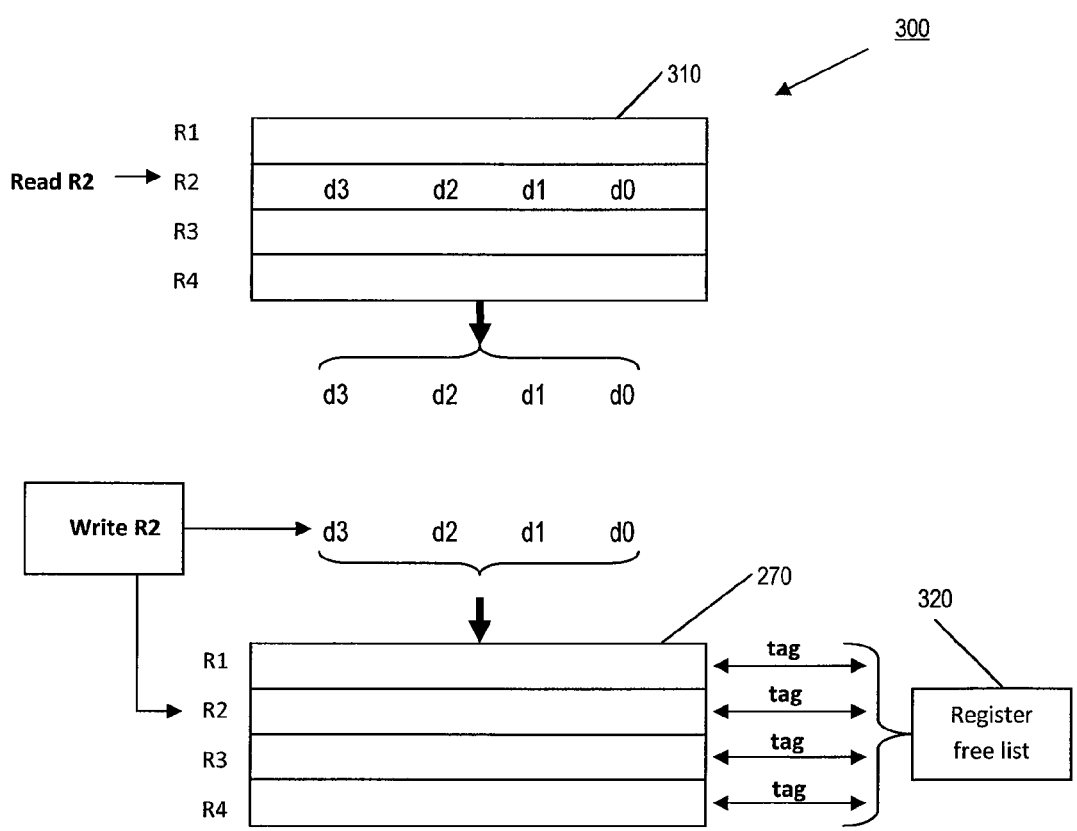
FIG. 3 illustrates the layout of a register file system according to one embodiment.

FIG. 3 illustrates the layout of a register file system 300 (e.g., corresponding to register file 270 above) according to one embodiment. Register file system 300 may include a register file 310 to hold one or more operands, address locations, data, etc. in each of a plurality of register lines (R1, R2, R3, etc.) that may be read out vertically, for example. In an exemplary embodiment, a tag is associated with each data block in a register line of register file 310.

A data structure (e.g., a data table, not shown) may keep track of the data by renaming each register line according to the tag associated with the data block. This is often termed a tag-indexed register file, where there is one large register file for data values contained in register lines, such that for every register line one tag is designated. For example, if a computing system comprises 80 physical registers lines, then seven-bit tags may be utilized, since a seven-bit tag can accommodate up to 128 (i.e., $2^7$) tag values for 128 register lines.

Referring to FIG. 2 again, when an instruction is issued to an execution unit 240, the tags associated with register lines that hold the target data are sent to the physical register file 270, where the values contained in the register lines corresponding to those tags are read and sent to execution unit 240. For example, in FIG. 3, in a register file 270, target data (e.g., d3, d2, d1, d0) may be read from register R2, resulting in the target data being fetched and provided to execution unit 240, as shown in FIG. 2. Similarly, data may be written to different register lines in register file 310 as identified by a designated tag.

As shown in FIGS. 2 and 3, register file 270 may be associated with a data structure (e.g., a register free list 320), which may be used to identify available registers in a computing system. Pointers (e.g., tags) in the register free list 320 are associated with entries in register file 270 to indicate whether a corresponding register is available (unallocated) or unavailable (allocated).

Figure 4A:
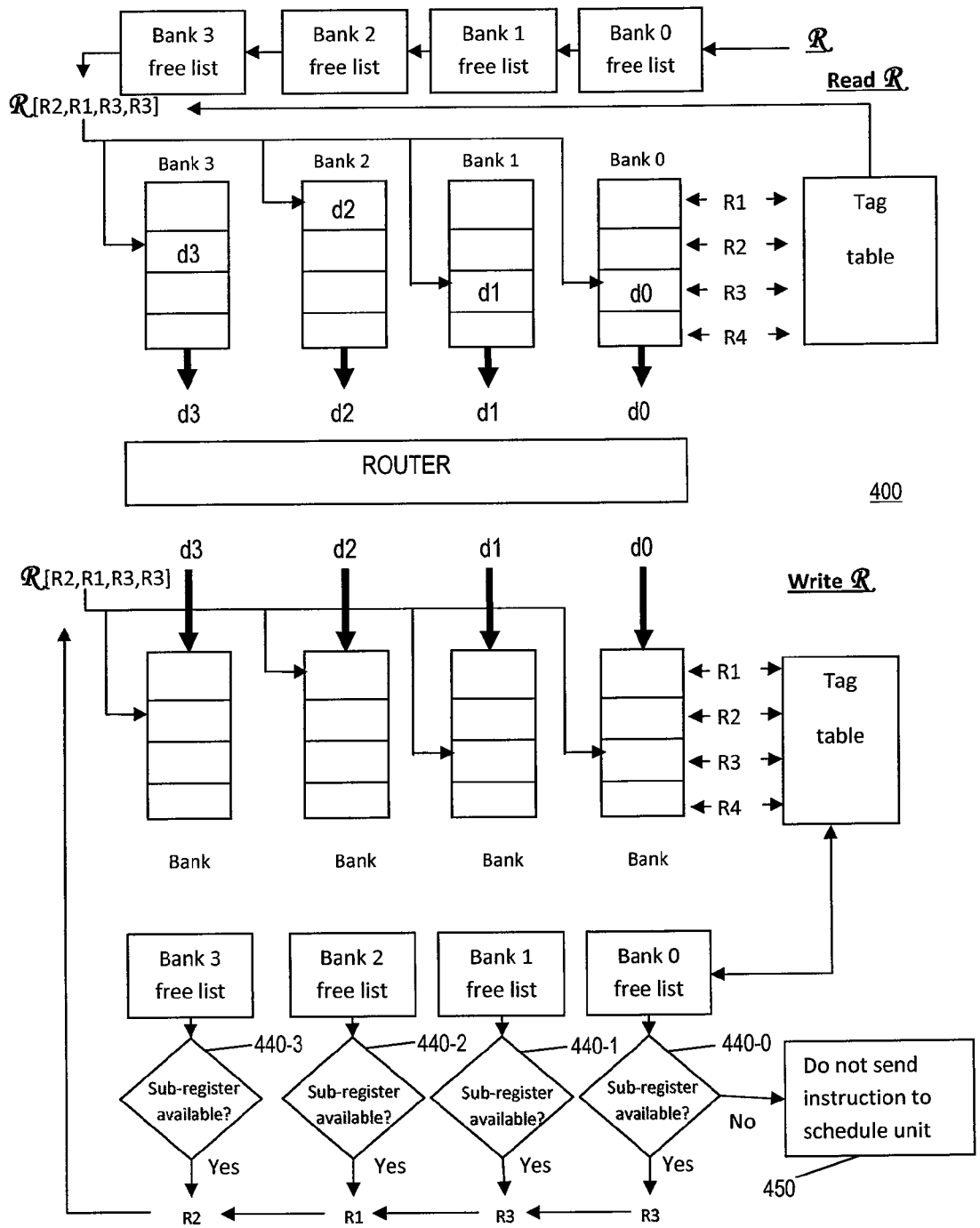
FIG. 4A illustrates a split register file (SRF) system according to one embodiment.
Figure 5A:
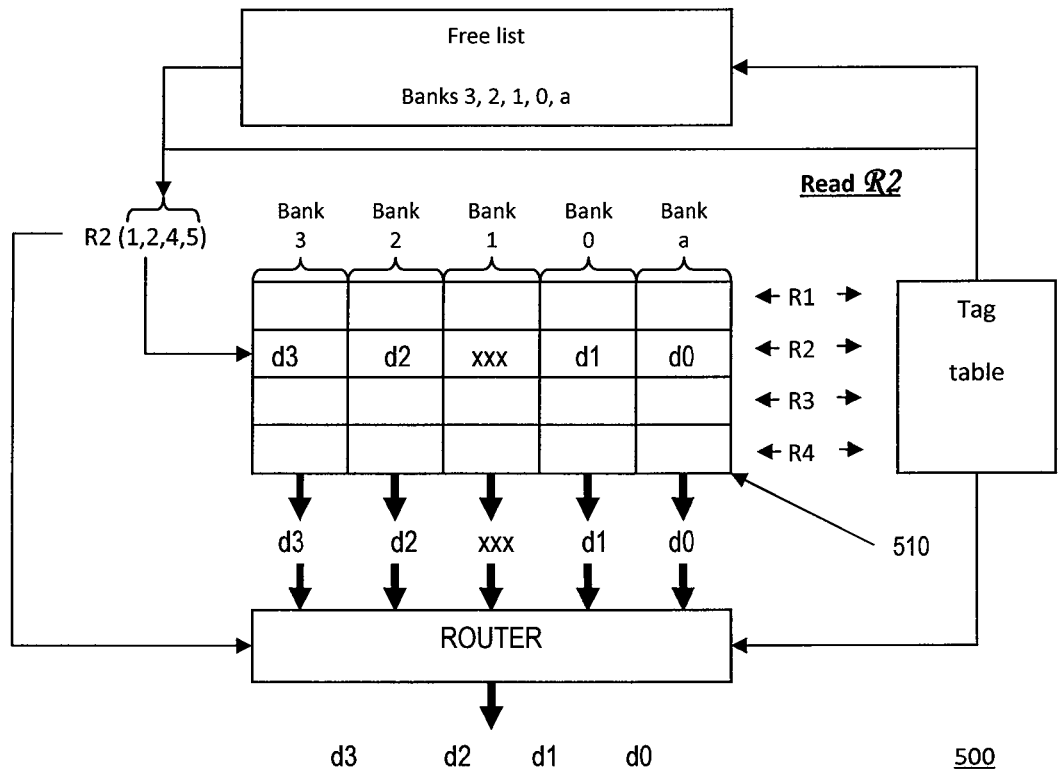
FIG. 5A illustrates a redundant register file (RRF) system according to one embodiment.

Data in a register, in some embodiments, may be accessed by referring to values stored in an independent data structure (e.g., a tag table as illustrated in FIGS. 4A and 5A) that may be associated with the register free list 320. In some embodiments, a tag table may not be implemented and the respective values may be stored in the register free list 320 in correspondence with entries in register file 270.

When an instruction needs to access a register (i.e., a target register in a read operation or a destination register in a write operation), for example, a rename table (e.g., the one identified as RAT in FIGS. 4B and 5B) and free list 320 provide the tag values corresponding to a register and/or sub-registers that store or are designated for storing the respective data on which the operation designated by the instruction is performed. A register allocated to storing data for an instruction being executed is released when the instruction retires in the retirement unit 250.

A register may be deemed as unavailable if a sub-portion (e.g., a block or a sub-register) of the register is faulty. In one or more embodiments, overall yield and availability of register file space may be improved by confining errors to smaller blocks or sub-registers of the register, such that the blocks or sub-registers containing faulty bits are deemed unavailable, rather than the entire register when fabrication limitations result in high faulty bit rates in the register space.

FIG. 4A illustrates a split register file (SRF) 400 architecture that helps improve efficient use of register file space, in accordance with one embodiment. As shown, a register line may be divided to include a plurality of sub-registers (e.g. R1-bank 3, R1-bank 2, R1-bank 1, and R1-bank 0). In one embodiment, the register file 270 may be split, for example vertically, in such a way that multiple portions of the data line are respectively allocated to multiple sub-registers in a register. In this manner, if a register includes a faulty bit, the faulty bit may render a sub-register unavailable rather than the whole register.

In one embodiment, register allocation may be performed by allocating each sub-register individually, for example, by referring to the free list or sub-lists. That is, a sub-register may be treated as an independent register for the purpose of data access. A sub-register having faulty bits may be deemed unavailable (i.e., discarded from use) by referencing (or removing a reference to) the sub-register's respective location (e.g., as identified by a tag and a bank reference) in register free list 320.

For example, each bank may be associated with a register free list (e.g., banks 0 through 3 free lists) and, in some embodiments, a tag table, as shown in FIG. 4A. In one embodiment, a register is deemed available if at least one sub-register in each bank associated with that register is available. For example, a register may be allocated so that data segments in a data line [d3, d2, d1, d0] are stored in sub-registers referenced by R2-bank 3, R1-bank 2, R3-bank 1 and R3-bank 0, respectively, as shown in FIG. 4A. Accordingly, each sub-register is identified by a tag (e.g., R1, R2, R3, etc.) and a bank (e.g., bank 0, bank 1, bank 2, etc.).

Reading the data stored in a register R may be accomplished, for example, by associating a tag with a register line (e.g., a tag for each sub-register in a register line) so that register file banks can be accessed in parallel. The tags may be stored in a data structure which may be stored in schedule unit 230 or in a data structure (hereafter referred to as "tag table" by way of example), as provided in further detail below.

In one embodiment, no tag table is implemented. In such embodiment, instructions are associated with a tag before reaching schedule unit 230. For instance, an exemplary instruction may be associated with input tag <R3,R3,R5,R1> for source operand 1, input tag <R4,R7,R2,R4> for source operand 2, and input tag <R1,R2,R1,R5> for output operand destination as shown in the example in FIG. 4B. Source tags may be obtained through a renaming process.

The destination register may be determined based on values stored in one or more bank free lists. One or more tags may be stored in schedule unit 230 together with remaining information of the instruction. When an instruction is sent to execution unit 240, execution unit 240 uses the tags to access register file 270 and fetch the respective data. Similarly, when execution unit 240 finishes execution of an instruction, execution unit 240 uses a destination tag to update the proper register (i.e., each one of the sub-registers in each one of the banks).

In one embodiment, an instruction may keep the tag of the entry in the first bank (e.g., bank 0). That tag (e.g., short tag) may be used to access another tag (e.g., full tag) stored in the tag table, which is used later to access banks of the SRF and assemble the linked sub-registers, thereby enabling the full data entry or instruction to be assembled.

In accordance with another embodiment a tag table may be implemented. In this embodiment instead of storing tags in schedule unit 230, the tags are stored in a tag table. For example, row 3 may hold <R3,R3,R5,R1>, row 4 may hold <R4,R7,R2,R4>, and so on. Execution of an instruction in schedule unit 230 may result in storing <R1,R2,R1,R5> as the destination register in row 1.

When the instruction is sent to execution unit 240, execution unit 240 accesses the tag table with tags (R3 and R4) and gets tags from rows 3 and 4 respectively. A similar process happens to write the output operand to destination register R1, and a similar process happens in retirement unit 250 to release registers. The benefit of such a tag table is to reduce the amount of space devoted to tags because each individual tag may be used by different instructions, and hence, by keeping tags in a tag table the amount of total space required is advantageously reduced.

Figure 4B:
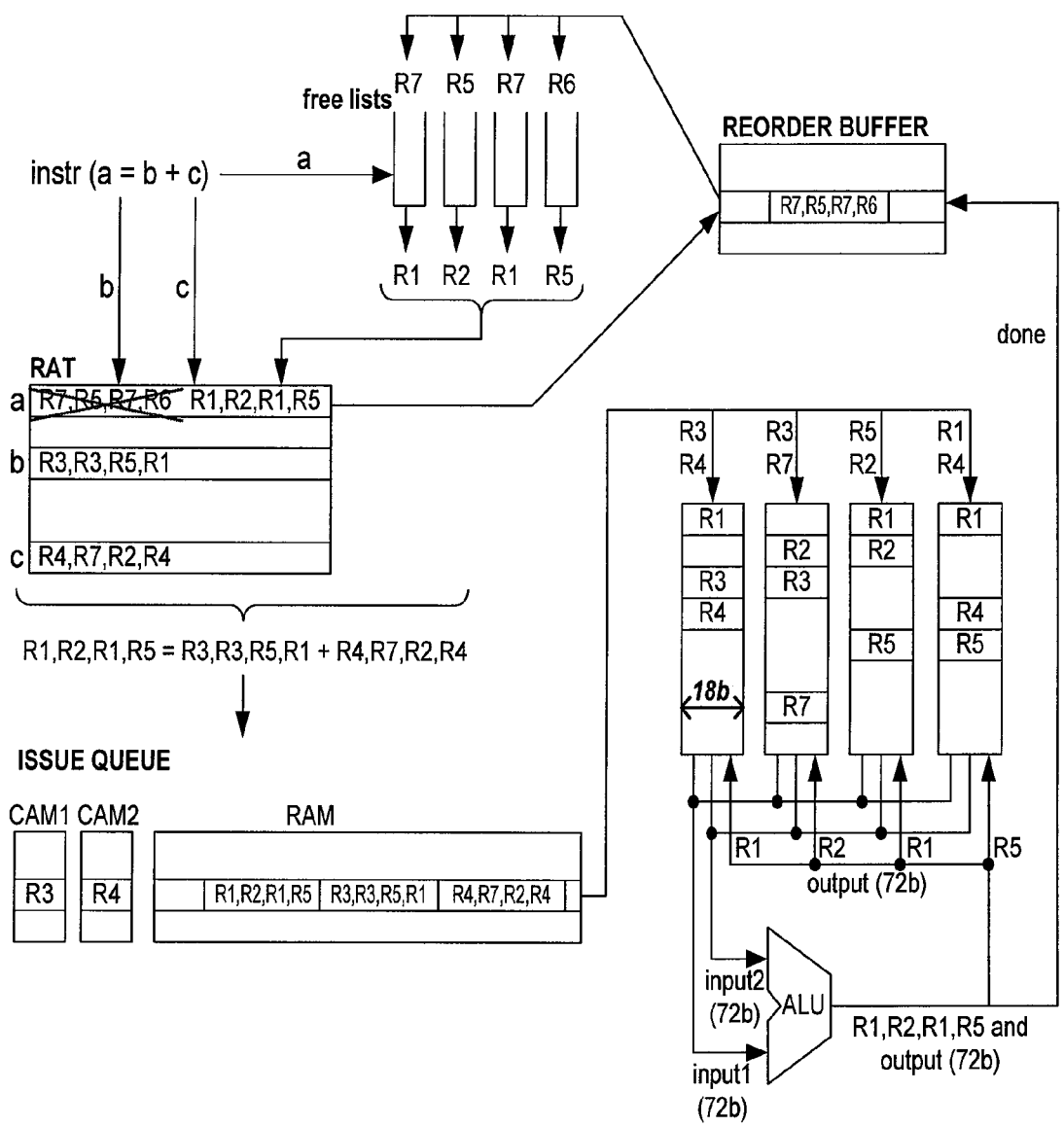
FIG. 4B illustrates an exemplary progression of values stored in a SRF in response to execution of an exemplary instruction, in accordance with one embodiment.

It may be appreciated that in accordance with the above implementation, the failure of a single bit in a line register does not result in the entire line register being disabled. Rather, since the line register is divided into multiple independently accessible sub-registers, the sub-registers containing the faulty bit are discarded, while advantageously the remaining sub-registers may be utilized. FIG. 4B illustrates in more detail an exemplary progression of values stored in a SRF in response to execution of an exemplary instruction, in accordance with one embodiment.

In accordance with another embodiment, FIG. 5A illustrates a redundant register file (RRF) system 500 which increases the yield of the register file 510 when fabrication limitations result in high faulty bit rates in register space. The redundant register file is based on splitting the register file 510 into banks of sub-registers (e.g., bank 3 to bank 0) as noted earlier so that the existence of a faulty bit in one row affects a single block in the line register rather than the whole register. In one exemplary implementation, one or more extra sub-register banks may be added to provide some redundancy in the number of sub-registers in a register line, in case one or more sub-registers in a register line include faulty bits.

In the exemplary embodiment shown in FIG. 5A, a 72 bit register may be split into 4 blocks each having 18 bits to produce four sub-register files with 18-bit registers. One or more extra banks with the same bit width (e.g., 18 bits) may be added to provide an additional bank. Depending on implementation, at the testing stage of fabrication, blocks with faulty bits are identified and such blocks are discarded from future. When a faulty bit is detected, for example, in one 18-bit block of a line register, that block is deemed disabled.

Figure 5A:
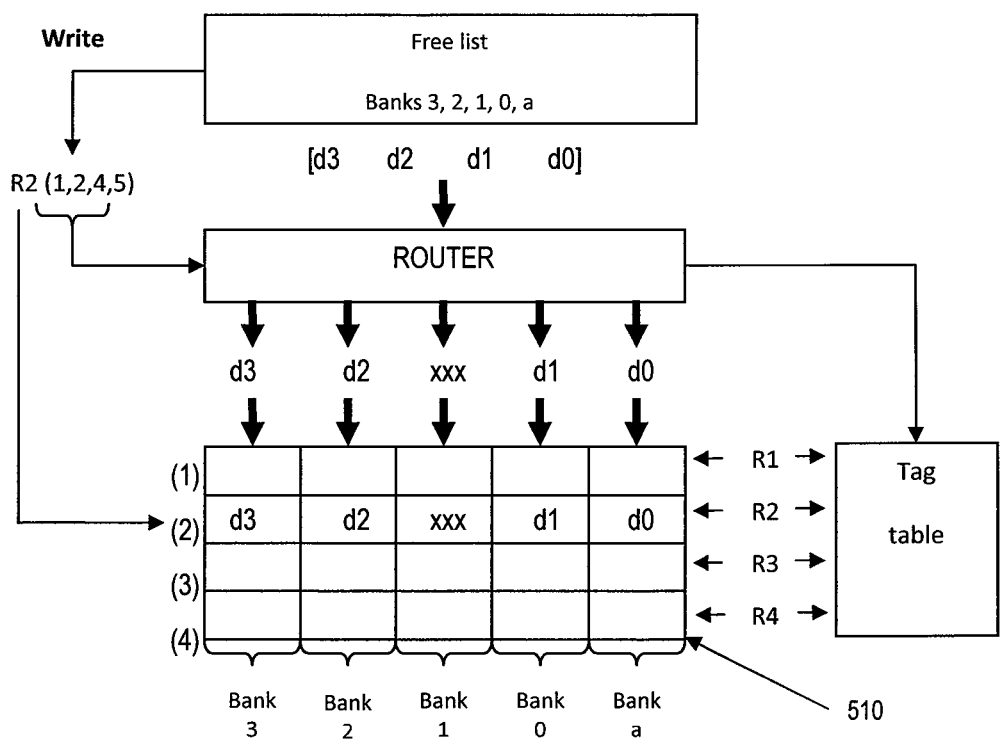

A register free list may be maintained to identify available or faulty blocks for each sub-register bank, for example. Each register free list entry may have some additional information indicating which blocks may be used. For example, in FIG. 5 the register free list indicates that R2 may use the blocks in row 2 with the exception of the block corresponding to bank 1 (the bank in the middle marked with xxx). During fabrication testing, registers with fewer sub-registers available than needed (e.g., if three or fewer 18-bit sub-registers are available, as in the exemplary embodiment of FIG. 5A), are deemed unavailable and removed from the register free list.

Figure 5B:
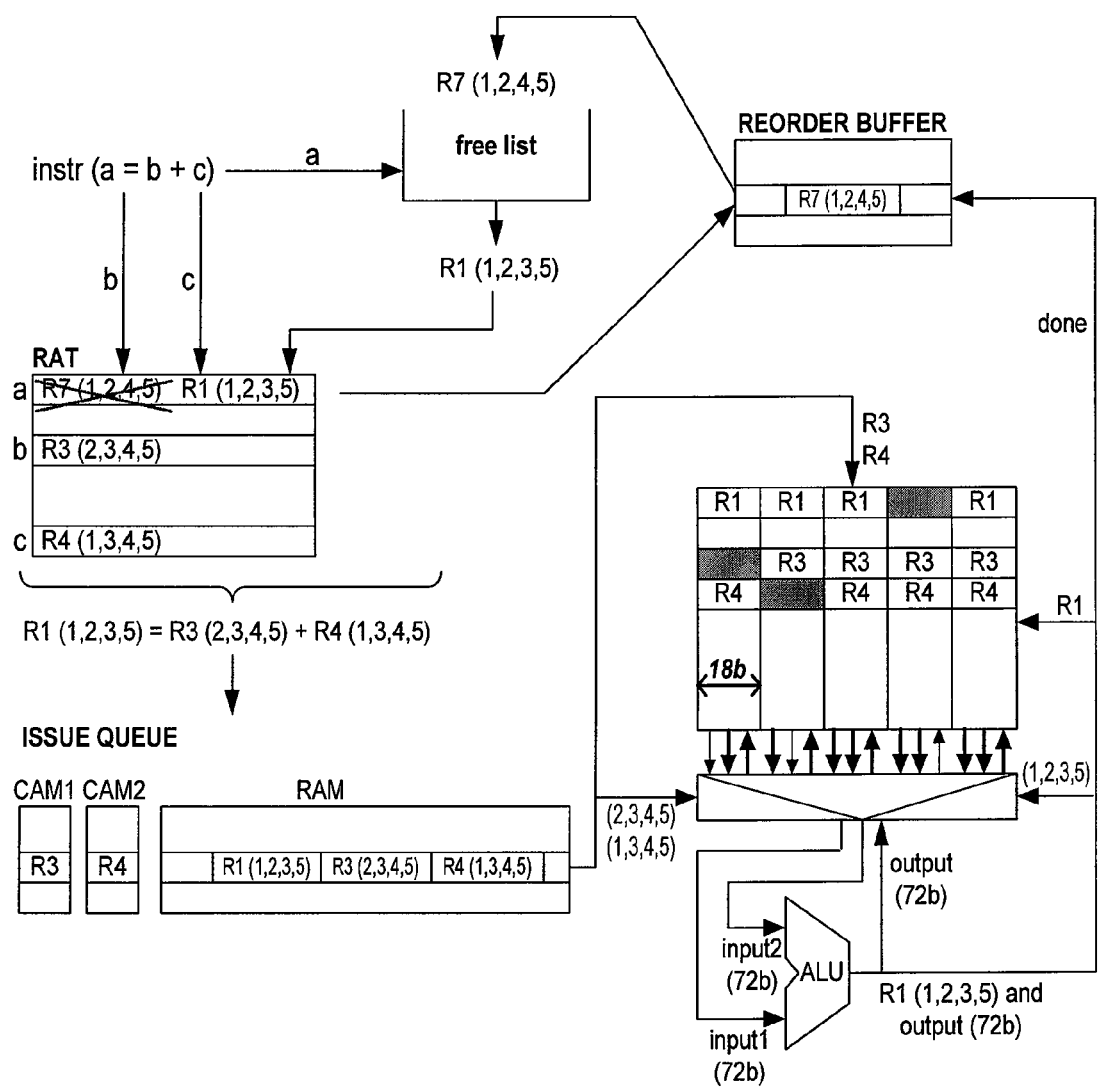
FIG. 5B illustrates an exemplary progression of values stored in a RRF in response to execution of an exemplary instruction, in accordance with one embodiment.

Referring to exemplary implementation in FIG. 5A, with one redundant bank of sub-registers, a 72 bit register may not be deemed disabled if one sub-register of the register lines contains faulty bits, because four sub-registers (e.g., including the additional sub-register) remain available. The additional sub-register may be in the same row as the other sub-registers of a line register. In an alternative embodiment, the additional sub-register may be also implemented to be in another row. FIG. 5B illustrates, in more detail, an exemplary progression of values stored in a RRF in response to execution of an exemplary instruction, in accordance with one embodiment.

Depending on implementation, it is possible that the present invention can take the form of an entirely hardware embodiment, an entirely software embodiment or an embodiment containing both hardware and software elements. A software embodiment may include firmware, resident software, microcode, etc., without limitation.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Other components may be coupled to the system. Input/output or I/O devices (including but not limited to keyboards, displays, pointing devices, etc.) can be coupled to the system either directly or through intervening I/O controllers. Network adapters (e.g., modem, cable modem, Ethernet cards) may also be coupled to the system to enable the data processing system to become coupled to other data processing systems or remote printers or storage devices through intervening private or public networks.

It should be understood that the logic code, programs, modules, processes, methods, and the order in which the respective elements of each method are performed are purely exemplary. Depending on the implementation, they may be performed in any order or in parallel, unless indicated otherwise in the present disclosure. Further, the logic code is not related, or limited to any particular programming language, and may comprise one or more modules that execute on one or more processors in a distributed, non-distributed, or multiprocessing environment.

Therefore, it should be understood that the invention can be practiced with modification and alteration within the spirit and scope of the appended claims. The description is not intended to be exhaustive or to limit the invention to the precise form disclosed. These and various other adaptations and combinations of the embodiments disclosed are within the scope of the invention and are further defined by the claims and their full scope of equivalents.

The invention claimed is:

1. An apparatus for storing X-bit digitized data, the apparatus comprising:
a plurality of registers each register configured for storing X bits,
wherein each register is partitioned into Y sub-registers such that each sub-register stores X/Y bits, and
wherein at least one extra sub-register of at least X/Y bits is incorporated in each register to provide redundancy in the number of sub-registers for a total of at least Y+1 sub-registers per register, so that if a first sub-register in a first register includes faulty bits, data destined for storage in the first sub-register is stored in a second sub-register of the first register that does not include faulty bits.

2. The apparatus of claim 1, wherein a first data structure stores values associated with each sub-register in a register, wherein a first value indicates that the sub-register includes faulty bits and a second value indicates that the sub-register does not include faulty bits.

3. The apparatus of claim 2, wherein a second data structure stores a reference to each register based on values in the first data structure to indicate whether a register is available to support a data operation.

4. The apparatus of claim 3, wherein a register is determined to be available if total number of sub-registers, in that register, that do not include faulty bits is equal to or greater than Y.

5. The apparatus of claim 3, wherein a register is determined to be unavailable if total number of sub-registers in that register is equal to Z, and number of sub-registers that include faulty bits is greater than Z-Y.

6. The apparatus of claim 3, wherein the data operation is a read or a write operation.

7. An apparatus for storing X-bit digitized data, the apparatus comprising:
a plurality of registers each register configured for storing X bits,
wherein each register is partitioned into Y sub-registers such that each sub-register stores at least X/Y bits, and
wherein if a first selected sub-register in a first register having faulty bits is unavailable for supporting a data operation, data destined for storage in the first sub-register is stored in a second selected sub-register in a second register that does not include faulty bits.

8. The apparatus of claim 7 comprising N registers, each partitioned into Y sub-registers, such that each partition includes sub-registers $R_1$ through $R_N$, respectively in one of said N registers, such that if a first selected sub-register in a first partition is unavailable for supporting a data operation due to faulty bits, data destined for storage in the first selected sub-register is stored in a second selected sub-register in the first partition that does not have faulty bits.

9. The apparatus of claim 8, wherein a first data structure stores values associated with each sub-register in a register, wherein a first value indicates that the sub-register includes faulty bits and a second value indicates that the sub-register does not include faulty bits.

10. The apparatus of claim 9, wherein a second data structure stores a reference to a partition based on values in the first data structure to indicate whether any sub-registers in said partition is available to support a data operation.

11. The apparatus of claim 10, wherein a sub-register is determined to be available if the sub-register does not include faulty bits.

12. The apparatus of claim 10, wherein the data operation is a read or a write operation.

13. A system comprising a register file for storing X-bit digitized data, the register file comprising:
   a plurality of registers each register configured for storing X bits,
   wherein each register is partitioned into Y sub-registers such that each sub-register stores X/Y bits, and
   wherein at least one extra sub-register of at least X/Y bits is incorporated in each register to provide redundancy in the number of sub-registers for a total of at least Y+1 sub-registers per register, so that if a first sub-register in a first register includes faulty bits, data destined for storage in the first sub-register is stored in a second sub-register of the first register that does not include faulty bits.

14. The system of claim 13 wherein a first data structure stores values associated with each sub-register in a register, wherein a first value indicates that the sub-register includes faulty bits and a second value indicates that the sub-register does not include faulty bits.

15. The system of claim 13 wherein a second data structure stores a reference to each register based on values in the first data structure to indicate whether a register is available to support a data operation.

* * * * *